United States Patent [19]
Shapiro et al.

[11] Patent Number: 5,973,568
[45] Date of Patent: Oct. 26, 1999

[54] POWER AMPLIFIER OUTPUT MODULE FOR DUAL-MODE DIGITAL SYSTEMS

[75] Inventors: Gary Shapiro, Albuquerque, N.Mex.; Greg Black, Vernon Hills, Ill.; Michael Newell, Williams Bay, Wis.

[73] Assignee: Motorola Inc., Schaumburg, Ill.

[21] Appl. No.: 09/088,356

[22] Filed: Jun. 1, 1998

[51] Int. Cl.[6] .................................. H03F 3/68; H04B 1/02
[52] U.S. Cl. .............................................. 330/295; 455/103
[58] Field of Search ................................ 330/124 R, 295, 330/286, 126, 129; 455/103, 127

[56] References Cited

U.S. PATENT DOCUMENTS

| 5,212,815 | 5/1993  | Schumacher .           |
|-----------|---------|------------------------|
| 5,432,473 | 7/1995  | Mattila et al. .       |
| 5,469,107 | 11/1995 | Kohno .                |
| 5,530,923 | 6/1996  | Heinonen et al. .      |
| 5,530,928 | 6/1996  | Wheatley, III et al. . |
| 5,541,554 | 7/1996  | Stengel et al. ............... 330/51 |
| 5,568,088 | 10/1996 | Dent et al. .......................... 330/124 R |
| 5,592,122 | 1/1997  | Masahiro et al. .       |
| 5,642,378 | 6/1997  | Denheyer et al. .       |
| 5,732,330 | 3/1998  | Anderson et al. .       |
| 5,732,345 | 3/1998  | Vice .                  |
| 5,754,943 | 5/1998  | Arai et al. ............................... 330/129 |

Primary Examiner—Robert Pascal
Assistant Examiner—Patricia Nguyen
Attorney, Agent, or Firm—Gary J. Cunningham

[57] ABSTRACT

A power amplifier output module 200 having low insertion loss and self-shielding properties for dual-mode digital systems is provided. Module 200 has a first power amplifier drive circuit comprising a first power amplifier 220 and a first output impedance matching network having integrated suppression of higher order harmonics 222. A second power amplifier drive circuit comprising a second power amplifier 224 and a second output impedance matching network having integrated suppression of higher order harmonics 226 is also provided. Module 200 also comprises a single diplexer 228 coupled to the first impedance matching network and the second impedance matching network. Module 200 also comprises a single broadband directional coupler 230, coupled to the diplexer 228, for coupling both the first power amplifier drive circuit and the second power amplifier drive circuit. Module 200 provides an integrated solution involving greater performance in a smaller package.

20 Claims, 3 Drawing Sheets

POWER AMPLIFIER OUTPUT MODULE FOR DUAL-MODE DIGITAL SYSTEMS

FIELD OF THE INVENTION

This invention relates to internal radio architecture for telecommunication devices, and more particularly to a power amplifier output module for dual band digital systems.

BACKGROUND OF THE INVENTION

As the use of many different telecommunication systems simultaneously in different locales creates greater flexibility for the user of cellular telephones, it also creates many challenges for the designers of the internal architecture of those cellular telephones. In addition to the traditional technological trends such as smaller size, lighter weight, and fewer part counts, designers are now being asked to also include greater capabilities into cellular telephones such as the ability to function at two or more different bands of the electromagnetic spectrum.

Incorporating dual mode/dual band capabilities into the radio architecture design is not a trivial process and may involve a significant change of thinking at the earliest stages of the design process.

FIG. 1 shows a block diagram of a radio architecture for a dual band cellular telephone in accordance with the prior art 100 is provided. Referring to FIG. 1, a radio transmit signal from a first band (Band #1) will pass through a driver 102, a power amplifier 104, an impedance matching network 106, a directional coupler 108, a harmonic filter 110. At this point, the signal will pass through a diplexer 112, and finally out the antenna 114. Similarly, for a radio transmit signal from a second band (Band #2) will pass through another driver 202, another power amplifier 204, another impedance matching network 206, another directional coupler 208, and another harmonic filter 210. The second signal will then pass through the diplexer 112, and finally out the antenna 114.

With this design, each of the bands have their own dedicated components. Each band has it's own impedance matching network, directional coupler, and harmonic filter. Such duplication of components may lead to a cellular telephone having additional circuitry, a high parts count, increased switching and power consumption, as well as increased volume, weight, and size.

A radio architecture design which provides a power amplifier output module for dual mode digital systems in a monolithic component and which integrates harmonic filtering requirements into an impedance matching network and which is capable of handling two discrete power amplifier drive circuits using a single coupler and a single antenna in a highly integrated multilayer ceramic package and which provides improved insertion loss and self-shielding properties would be considered an improvement in the art.

DETAILED DESCRIPTION OF A PREFERRED EMBODIMENT

Figure 1:
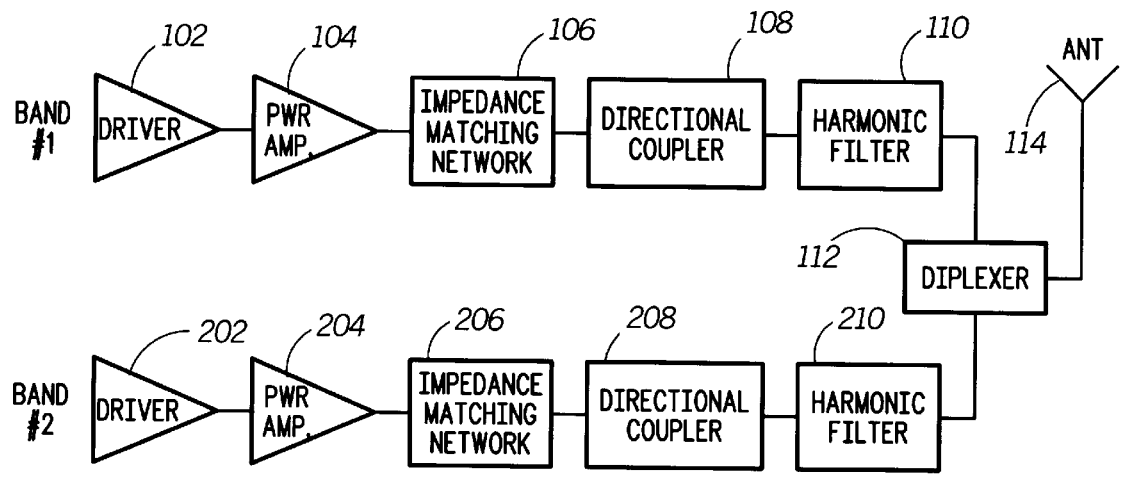
FIG. 1 shows a block diagram of a dual band front end radio design in accordance with the prior art.

As the size of cellular telephones decreases with every new model, it becomes increasingly necessary to integrate many more components and functions into fewer discrete components. With the design of the power amplifier output module for dual mode digital systems of the instant invention, numerous advantages may be realized by the integration of what were previously many components into a single monolithic component module.

Aside from the obvious advantages realized from a lower part count, smaller size and weight and less manufacturing steps, other engineering advantages may also be expected. First, the power amplifier output module of the present invention is less lossy at higher frequencies relative to the prior art manufacturing technique which involves a circuit with discrete components mounted to traditional substrates (e.g. FR-4). The integrated module of the present design also provides fewer interconnections which may result in a final product having a greater reliability. Still another advantage realized from the integration of the numerous circuit components is the resulting reduced switching which may be necessary to operate the radio. In radio architecture design, diplexing is generally preferred to switching due to the lower loss of the diplexer when low-loss materials are employed. Additionally, diplexing can be readily achieved in a monolithic component such as the output module of the present invention. Stated another way, diplexing requires the same elements as are used in conventional multilayer ceramic packaging processes. The reduced switching, circuitry and number of couplers may result in less power consumption, greater battery life, and longer talk time.

The instant invention has many advantages. Foremost, the power amplifier output module for dual mode digital systems actually reduces the size, increases functionality, and improves the performance of dual band power amplifier circuits. This is accomplished through the design and implementation of a multilayer ceramic package which integrates various front end functions of a radio or cellular telephone.

The benefits realized by integrating various components into a single module cannot be understated. The synergistic advantages realized through integration are significant. For example, the circuit in the integrated module is not as lossy as discrete components on a printed circuit board such as an FR-4 material. Moreover the circuit paths are not as long and consequently, require less power and may be more light-weight and reliable.

Many prior designs employed discrete devices on a printed circuit board or the like. This presented a challenge as the printed circuit boards with transmission lines were lossy and tended to degrade circuit performance. The integrated solution of the present invention provides a more reliable circuit while simultaneously clearing ever precious real estate on the printed circuit board. The use of multilayer ceramic material allows for the realization of lower loss transmission line components than may be achieved using traditional printed circuit board technology. Multilayer ceramic materials are ideally suited to provide some of the electrical properties such as high dielectric constants, high electrical Q, and low loss required for radio-frequency (RF) applications. Generally, high-Q materials exhibit low-loss properties in radio frequency (RF) applications. Stated another way, the integrated ceramic multilayer device creates greater functionality in a smaller volume than the traditional printed circuit board approach.

Figure 5:
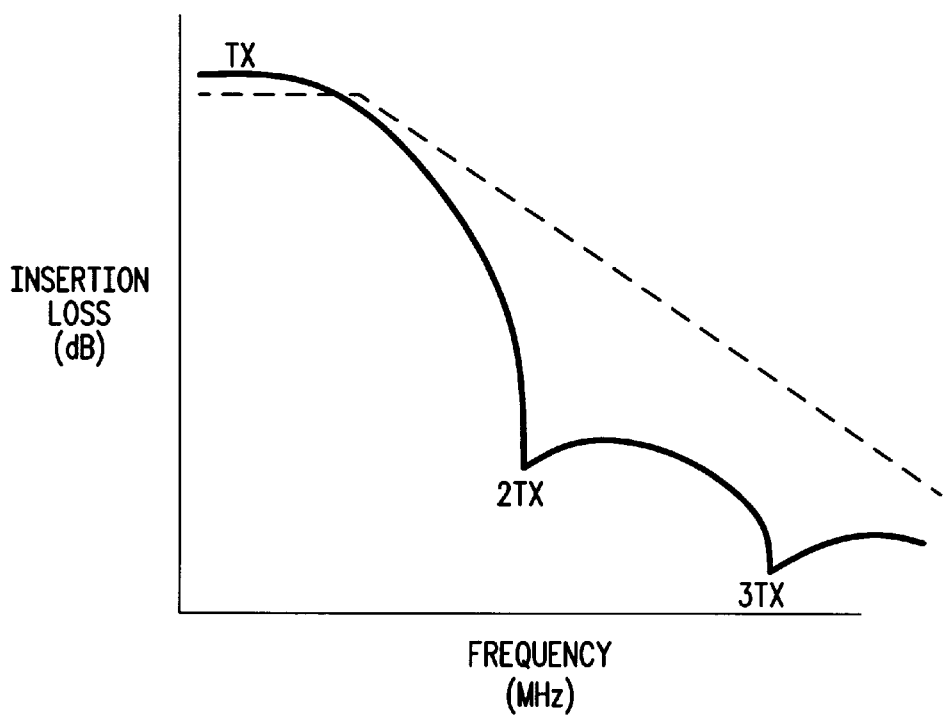
FIG. 5 shows a frequency response curve incorporating the prior art design (dashed line) and a frequency response curve for the power amplifier output module for dual mode digital systems in accordance with the present invention.

One important aspect of the Applicant's invention involves the fact that the integrated power amplifier output module effectively attenuates second and third order harmonics, a constant nemesis in radio design. Referring to FIG. 5, the solid line reveals that the attenuation of the second and third harmonics is significantly greater than that for prior lowpass filter designs (see dashed lines). This is achieved by the circuit design which effectively integrates the impedance matching network and the harmonic filter together in a compact, integrated design. Significantly, the fact that the effective attenuation of the higher order harmonics does not adversely effect the "in band" loss provides another architecture advantage.

This invention allows for effective coupling, filtering, and output impedance matching of a signal in a first band and a signal in a second band. In one embodiment, the first band will be a digital signal and the second band will be a digital signal. For example, a first digital band may be GSM (880–960 MHz) and the second digital band may be DCS (1710–1880 MHz). Of course, this design may be adapted for any two bands of the electromagnetic spectrum. This capability is becoming increasingly important as telecommunication systems are now expected to be capable of handling and processing signals at various frequencies in a manner which is transparent to the user or consumer.

Figure 2:
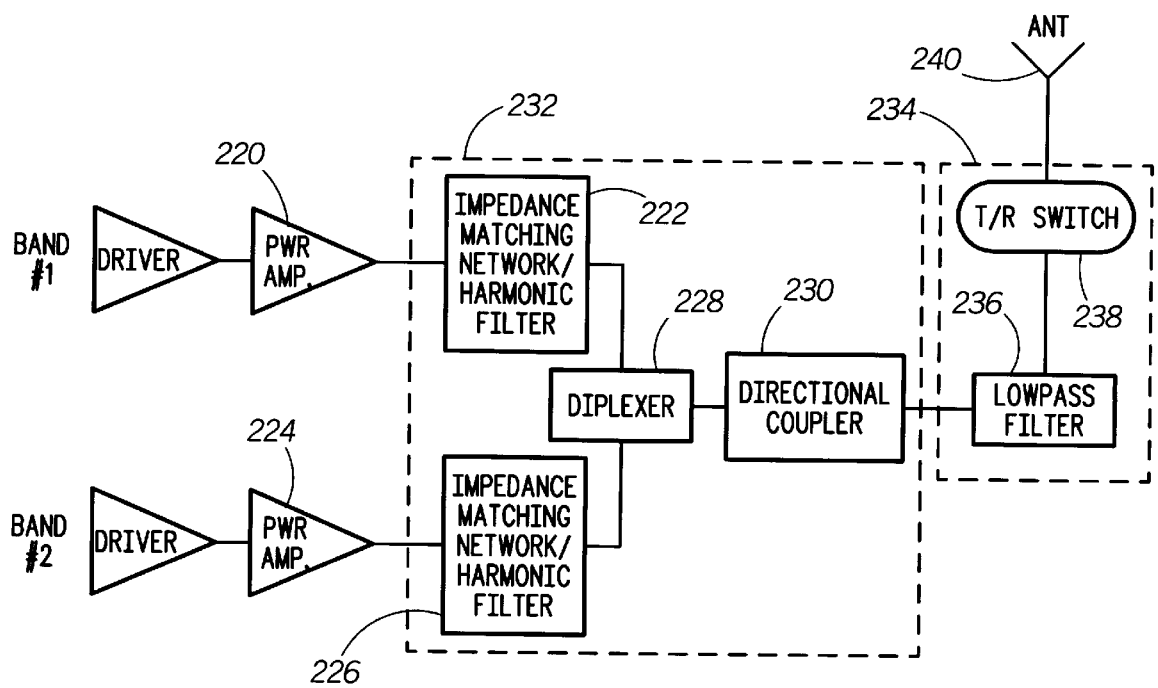
FIG. 2 shows a block diagram of a power amplifier output module for dual mode digital systems in accordance with the present invention.

In FIG. 2, a block diagram of the power amplifier output module 200 is provided. Referring to FIG. 2, module 200 having low insertion loss and self-shielding properties for dual-mode digital systems contains a first power amplifier drive circuit for operating in a first digital mode (Band #1). This includes a first power amplifier 220 and a first output impedance matching network having integrated suppression of higher order harmonics 222.

A second power amplifier drive circuit for operating in a second digital mode (Band #2) contains a second power amplifier 224 and a second output impedance matching network having integrated suppression of higher order harmonics 226. A single diplexer 228 coupled to the first impedance matching network 222 and the second impedance matching network 226 is also provided. Single diplexer 228 selectively passes a signal from the first power amplifier drive circuit (Band #1) while simultaneously attenuating a signal from the second power amplifier drive circuit (Band #2) in a first condition. Single diplexer 228 selectively passes a signal from the second power amplifier drive circuit (Band #2) while simultaneously attenuating a signal from the first power amplifier drive circuit (Band #1) in a second condition.

In a preferred embodiment, diplexer 228 has a lowpass response characteristic to the lower band, thus further attenuating the harmonics of the low band signal. Similarly, diplexer 228 has a highpass response characteristic to the higher band. This feature is still another advantage realized with the integration of the power amplifier output module of the present invention.

In a preferred embodiment, diplexer 228 may include a lowpass filter and a highpass filter. When band #1 is the low band and band #2 is the high band, the input to diplexer 228 for band #1 is a lowpass response and the input to diplexer 228 for band #2 is a highpass response.

The block diagram in FIG. 2 also shows a single broadband directional coupler 230, coupled to the diplexer 228, for coupling both the first power amplifier drive circuit (Band #1) and the second power amplifier drive circuit (Band #2). In a preferred embodiment, the single broadband directional coupler will be approximately −20dB. However, with other designs required for other applications, the directional coupler may have other desirable values.

Another interesting aspect of FIG. 2 involves the blocks enclosed by dashed line 234. Referring to FIG. 2, it may sometimes be desirable to further incorporate a lowpass filter 236 into module 200 to address the harmonics of the high band signal. Additionally, a T/R (transmit/receive) switch 238 may be placed in line between lowpass filter 236 and the antenna 240. In another embodiment, it may be desirable to replace T/R switch 238 with a multiplexer. For all radios, either a T/R switch or a multiplexer (a duplexer for example) is required between the output module 200 and the antenna 240. Moreover, a T/R switch may be incorporated directly into output module 200 or it may be discretely be placed on the radio circuit board.

In other embodiments of power amplifier output module 200, a single antenna, coupled to the directional coupler, for receiving a signal in the first digital mode and the second digital mode may be incorporated into the module. Similarly, other embodiments may also include a power amplifier attached to or built directly into module 200. In this instance, the multilayer package may comprise a power amplifier with an active match tuning function integrated therein. However, in FIG. 2, a dashed line 232 encloses the block diagram components found in a most preferred embodiment of the power amplifier output module shown in FIG. 3.

Figure 3:
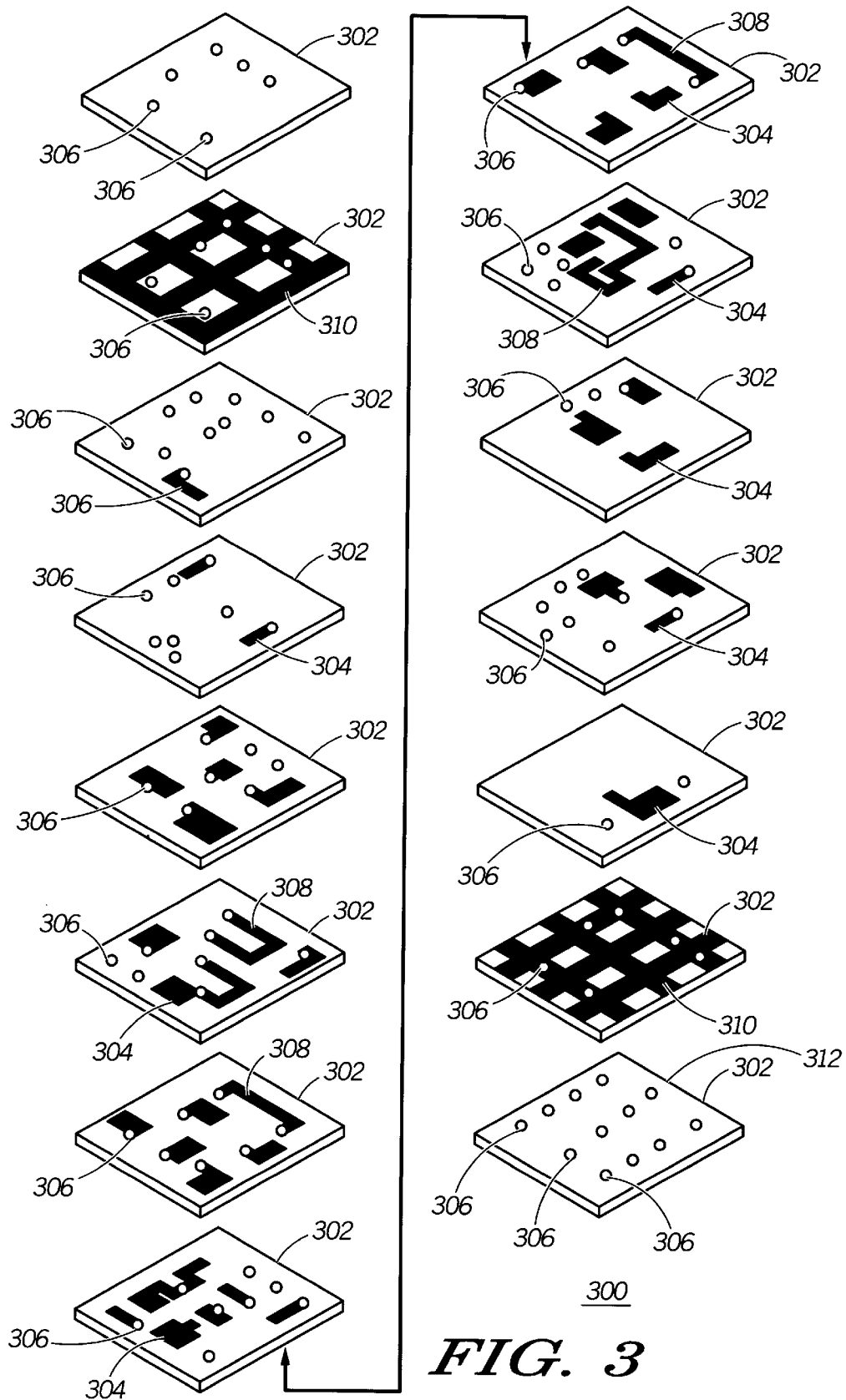
FIG. 3 shows a exploded view of a multilayer package which forms the power amplifier output module for dual mode digital systems in accordance with the present invention.

FIG. 3 shows an exploded view of the various multilayer sheets of dielectric ceramic which together provide the power amplifier output module 300 of the instant invention. Referring to FIG. 3, a set of dielectric sheets 302 of ceramic are provided, each having conductive paste print patterns 304 deposited thereon. A set of via holes 306 may also be punched into each of the sheets. In output module 300, via holes 306 are vertically aligned and filled with a conductive paste material. This has not been shown in FIG. 3 for reasons of clarity. Additionally, the exact location of the printed patterns on each of the dielectric sheets has also been exaggerated.

FIG. 3 is intended only to give a representative sample of the interior layers of the power amplifier output module, and is not intended to be a schematic for manufacturing. FIG. 3 does show, however, various printed transmission lines 308, the buried mesh ground planes 310 and the keyed interconnect configuration 312. It should also be noted that the dielectric sheets interior to the module 300 are sufficiently unpopulated such that numerous other components and circuits may be incorporated thereon.

Figure 4:
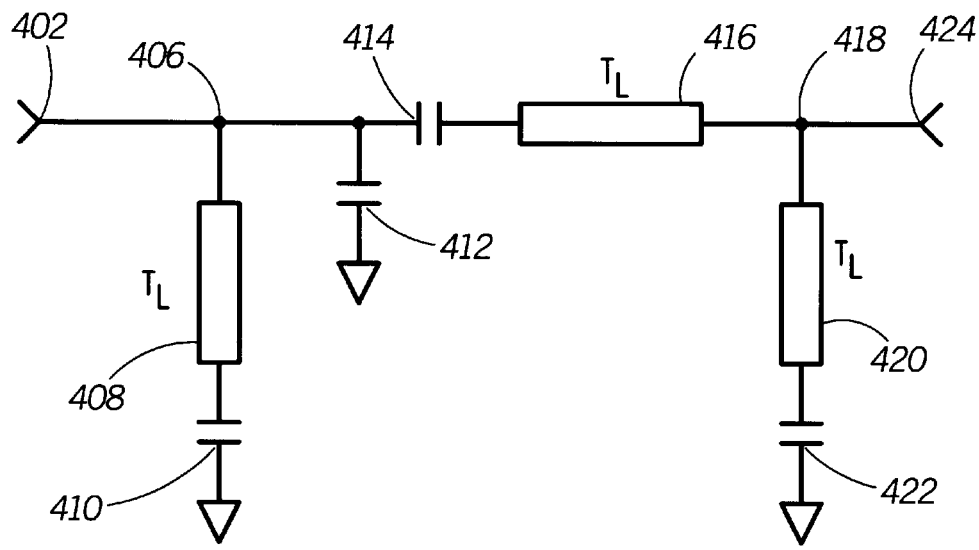
FIG. 4. shows a circuit diagram of the integrated impedance matching network/harmonic filter in accordance with the present invention.

FIG. 4 shows an electrical schematic of the impedance matching network/harmonic filter aspect of the instant invention. This corresponds with either of blocks 222 or 226 shown in FIG. 3. The integration of the impedance matching and harmonic filtering functions of power amplifier output module 300 is an important aspect of Applicant's invention. This is accomplished with a novel circuit as is shown in FIG. 4.

Referring to FIG. 4, the impedance matching network/harmonic filter circuit 400 contains an input 402 which is connected in series with a first node 406. Extending from the first node 406 is a resonant transmission line 408 and capacitance 410 to ground. This leg of the circuit provides the harmonic filtering function. Also extending from the first node 406, in a pi-network design, are a shunt capacitor to ground 412 and a series capacitor 414. Capacitor 414 is in series with a series transmission line 416 which is also in series with a second node 418.

It should be noted that it is the shunt capacitor to ground 412 along with the series capacitor 414 and the series transmission line 416 which provide the impedance transformation from low impedance (1–5Ω, for example) to high impedance (50Ω, for example). Also extending from second node 418 is a second leg comprising a resonant transmission line 420 and capacitance to ground 422. Second node 418 is also in series with an output 424. Of course, this circuit would then necessarily be coupled to the remaining circuitry in the power amplifier output module.

Although a most preferred embodiment of the present invention contemplates a dual mode digital system, the radio architecture may easily be altered, by selective transmission line patterning on the dielectric sheets, to also accommodate one digital band and one analog band in an electronic device. Such a design, however, would speculatively require two separate and distinct broadband couplers, one for each band. Nevertheless, the other advantages of integration, such as improved harmonic rejection and self-shielding properties, would still be achieved. An example of this would be one digital band, such as PCS (1850–1930 MHz) and one analog band, such as AMPS (824–894 MHz). Accordingly, this may also be applied to other related frequencies.

In one embodiment of the present invention, the power amplifier output module may be manufactured in the form of a multilayer ceramic package. Such a multilayer ceramic package may be comprised of a plurality of sheets of dielectric material having conductive paste transmission lines deposited therebetween. The multilayer ceramic package may further comprise a semiconductor integrated circuit attached to one of the plurality of dielectric sheets.

This semiconductor integrated circuit may take many forms. Typical technologies which may be employed include flip-chip, BGA devices, wirebond devices, plastic or ceramic packages, or any other industry standard technology. In a preferred embodiment, a semiconductor flip-chip integrated circuit which uses a gallium arsenide material may be used. In other embodiments, the semiconductor material may be silicon, germanium, silicon-germanium, or any other suitable material.

In the event that a semiconductor integrated circuit (IC) is incorporated into output module 200, a design strategy that may offer a great advantage involves placing the IC in a cavity in module 200. Whereas cavities are easily made in multilayer packages such as module 200, a "height above board" dimension may be minimized thus providing further component size advantages to module 200.

Integration to the degree provided by the present power amplifier output module provides an important solution to the radio-frequency (RF) designer. By integrating the transmit (Tx) circuit functionality into a single module requires less circuit board space than using a discrete approach. The resulting module also performs multiple functions in a single, standard component.

The multiple functions performed by the power amplifier output module are diverse, but all important to the effective performance of the cellular telephone or radio. The 20 dB directional coupler is required to effectively couple the signal to the automatic output controller (AOC). The AOC is a circuit which receives the coupled signal and subsequently adjusts the power output of the power amplifier (PA) to remain within a desired specification. The diplexer performs the functions of two filters, to effectively separate/combine the high and low bands. The impedance matching networks provide an impedance match from the low impedance of the power amplifier (PA) output to 50 ohms (Ω) or any required impedance. This maintains an efficiently operating amplifier and provides stability for the amplifier. The present invention cleverly provides the harmonic filtering function along with the respective impedance matching networks.

Moreover, the impedance matching network of the present invention is a distributed matching network. This is more than merely a set of lumped inductors and/or capacitors. In other words, the matching network is distributed over various of the dielectric sheets.

The power amplifier output module of the instant invention is most preferably achieved in a high Q, low loss, multilayer ceramic package. Such a multilayer package may be fabricated from layers or sheets of dielectric material, such as a barium titanate, neodymium titanate material, or glass loaded alumina, for example. The sheets of dielectric are formed using industry-standard multilayer manufacturing processes and technologies. Conductive paste materials are subsequently deposited, typically by screen printing, onto the sheets. The sheets may be punched to provide vias or interconnects between the layers, and the sheets are ultimately laminated under pressure and temperature. The exact number of layers and the designs or patterns printed on each layer will be application specific and will vary for each individual application. In a preferred embodiment, the power amplifier output module will be disposed in a multilayer ceramic package containing sheets of dielectric material having conductive paste transmission lines and elements deposited therebetween.

FIG. 5 shows, in graphic form, the improved insertion loss values realized by integrating various front-end radio functions into a multilayer ceramic package. Referring to FIG. 5, a graph of insertion loss, measured in decibels (dB) along the y-axis, and frequency, measured in megahertz (MHz) along the x-axis, is provided. In the region of interest, that is understood to mean at the second and third harmonics, the prior radio architecture provided only marginal attenuation (see dashed line). By integrating the circuits into a power amplifier output module, substantially better performance is achieved (see solid line). In addition to the reduction in size and volume, the output module of the instant invention also provides improved performance in the form of greater harmonic rejection at the second and third harmonics.

For certain applications it may be desirable to have the input/output connections strategically placed in a pre-arranged condition, providing a "keyed" configuration, such that the package may only attach to the printed circuit board in one and only one very specific manner. For other applications, it may be preferable to use industry standard spacings, sizes, and footprint topographies.

Another interesting aspect of Applicant's invention involves a buried mesh ground plane. Whereas the use of buried ground planes are well known in the component manufacturing industry, the present power amplifier output module employs a buried mesh-type ground plane which is printed on one of the dielectric sheets. Such a mesh ground plane provides a sufficient amount of metallization to provide adequate grounding, however, also leaves a sufficient area unmetallized so as to allow sufficient adhesion of the sheets of ceramic to each other.

Whereas the power amplifier output module of the instant invention certainly provides a small sized component inside a cellular telephone, for example, it nevertheless may also provide a base substrate for other semiconductor components. In one embodiment of the present invention, the power amplifier output module may be further mounted with other integrated circuit (IC) chips and the like. For example, in another embodiment of the present invention, the output module may further include a semiconductor flip-chip integrated circuit attached to one of the plurality of dielectric sheets. Thus, even greater consolidation and space savings may occur.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A power amplifier output module having low insertion loss and self-shielding properties for dual-mode digital systems, comprising:

a first power amplifier drive circuit for operating in a first digital mode comprising a first power amplifier and a first output impedance matching network having integrated suppression of higher order harmonics;

a second power amplifier drive circuit for operating in a second digital mode comprising a second power amplifier and a second output impedance matching network having integrated suppression of higher order harmonics;

a single diplexer coupled to the first impedance matching network and the second impedance matching network, the single diplexer selectively passing a signal from the first power amplifier drive circuit while simultaneously attenuating a signal from the second power amplifier drive circuit in a first condition and selectively passing a signal from the second power amplifier drive circuit while simultaneously attenuating a signal from the first power amplifier drive circuit in a second condition; and a single broadband directional coupler, coupled to the diplexer, for coupling both the first power amplifier drive circuit and the second power amplifier drive circuit.

2. The power amplifier output module of claim 1, further comprising a lowpass filter, coupled to the single broadband directional coupler and coupled to a single antenna through a transmit-receive switch, for receiving a signal from the first power amplifier drive circuit in the first digital mode and the second power amplifier drive circuit in the second digital mode.

3. The power amplifier output module of claim 1, further comprising a lowpass filter, coupled to the single broadband directional coupler and coupled to a single antenna through a multiplexer, for receiving a signal from the first power amplifier drive circuit in the first digital mode and the second power amplifier drive circuit in the second digital mode.

4. The power amplifier output module of claim 1, wherein the first impedance matching network and the second impedance matching network attenuate both second and third order harmonics.

5. The power amplifier output module of claim 1, wherein the first impedance matching network and the second impedance matching network further provide the function of harmonic suppression.

6. The power amplifier output module of claim 1, wherein the first impedance matching network and the second impedance matching network are distributed and include harmonic filtering capabilities.

7. The power amplifier output module of claim 1, wherein the single broadband coupler is about −20dB.

8. The power amplifier output module of claim 1, disposed in a multilayer ceramic package comprising a plurality of sheets of dielectric material having conductive paste transmission lines deposited therebetween.

9. The multilayer ceramic package of claim 8, wherein a plurality of input/output contacts are disposed on a first of said plurality of sheets of dielectric material and said plurality of input/output contacts are arranged in a keyed configuration for providing accurate attachment to a printed circuit board or other substrate.

10. The multilayer ceramic package of claim 8, where a buried mesh ground plane is provided on a second of said plurality of sheets of dielectric material.

11. The multilayer ceramic package of claim 8, further comprising a semiconductor integrated circuit attached to one of the plurality of dielectric sheets.

12. The multilayer ceramic package of claim 8, further comprising a semiconductor integrated circuit disposed in a cavity in one of the plurality of dielectric sheets of the power amplifier output module.

13. The multilayer ceramic package of claim 8, further comprising a flip-chip semiconductor integrated circuit disposed in a cavity in the power amplifer output module.

14. The multilayer ceramic package of claim 8, further comprising a power amplifier with active match tuning integrated therein.

15. A dual mode communication device having a first digital band and a second digital band, the communication device having a power amplifier output module for dual-band digital systems, comprising:

a first power amplifier drive circuit for operating in a first digital band comprising a first power amplifier and a first output impedance matching network having integrated suppression of higher order harmonics;

a second power amplifier drive circuit for operating in a second digital band comprising a second power amplifier and a second output impedance matching network having integrated suppression of higher order harmonics;

a single diplexer coupled to the first impedance matching network and the second impedance matching network, the single diplexer selectively passing a signal from the first power amplifier drive circuit while simultaneously attenuating a signal from the second power amplifier drive circuit in a first condition and selectively passing a signal from the second power amplifier drive circuit while simultaneously attenuating a signal from the first power amplifier drive circuit in a second condition; and a single broadband directional coupler, coupled to the diplexer, for coupling both the first power amplifier drive circuit and the second power amplifier drive circuit.

16. The dual mode communication device of claim 15, further comprising a lowpass filter, coupled to the single broadband directional coupler and coupled to a single antenna through a transmit-receive switch, for receiving a signal from the first power amplifier drive circuit in the first digital band and the second power amplifier drive circuit in the second digital band.

17. The dual mode communication device of claim 15, further comprising a lowpass filter, coupled to the single broadband directional coupler and coupled to a single antenna through a multiplexer, for receiving a signal from the first power amplifier drive circuit in the first digital band and the second power amplifier drive circuit in the second digital band.

18. The dual mode communication device of claim 15, wherein the first digital band is GSM and the second digital band is DCS.

19. The dual mode communication device of claim 15, wherein the first digital band is DCS and the second digital band is different from the first digital band.

20. The dual mode communication device of claim 15, wherein the first output impedance matching network and the second output impedance matching network are distributed and include harmonic filtering capabilities.

* * * * *